United States Patent
Shizuka

(10) Patent No.: US 11,198,368 B2
(45) Date of Patent: Dec. 14, 2021

(54) VEHICULAR CHARGING CONTROL SYSTEM

(71) Applicant: TOYOTA JIDOSHA KABUSHIKI KAISHA, Toyota (JP)

(72) Inventor: Satoshi Shizuka, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 157 days.

(21) Appl. No.: 16/672,607

(22) Filed: Nov. 4, 2019

(65) Prior Publication Data

US 2020/0198477 A1    Jun. 25, 2020

(30) Foreign Application Priority Data

Dec. 25, 2018  (JP) .............................. JP2018-241377

(51) Int. Cl.
*B60L 50/60* (2019.01)
*B60L 53/14* (2019.01)
*B60L 53/80* (2019.01)
*G01R 11/56* (2006.01)

(52) U.S. Cl.
CPC ............... *B60L 50/66* (2019.02); *B60L 53/14* (2019.02); *B60L 53/80* (2019.02); *G01R 11/56* (2013.01)

(58) Field of Classification Search
CPC .. B60L 58/12; B60L 58/15; B60L 7/10; B60L 7/12; B60L 7/14; B60W 30/18127; B60K 2016/003; Y02T 10/90
See application file for complete search history.

(56) References Cited

U.S. PATENT DOCUMENTS

| 2008/0143292 A1* | 6/2008 | Ward .................... B60L 58/15 320/101 |
| 2018/0201150 A1 | 7/2018 | Kubo et al. |
| 2020/0171970 A1* | 6/2020 | Lee ......................... B60L 58/12 |

FOREIGN PATENT DOCUMENTS

JP    2017-123765 A    7/2017

* cited by examiner

*Primary Examiner* — David V Henze-Gongola
(74) *Attorney, Agent, or Firm* — Oliff PLC

(57) ABSTRACT

A vehicular charging control system using a solar panel includes: a first battery; a calculation unit that calculates a chargeable electric power amount (an amount of electric power with which the first battery can be charged until the SOC of the first battery reaches a predetermined value); a determination unit that determines whether regenerative electric power is being generated; and a control unit that controls charging of the first battery with electric power generated by the solar panel. The control unit allows the first battery to be charged with the electric power generated by the solar panel up to an upper limit set to the chargeable electric power amount when regenerative electric power is not being generated, and up to an upper limit set to an electric power amount obtained by subtracting the regenerative electric power amount from the chargeable electric power amount when regenerative electric power is being generated.

1 Claim, 3 Drawing Sheets

VEHICULAR CHARGING CONTROL SYSTEM

INCORPORATION BY REFERENCE

The disclosure of Japanese Patent Application No. 2018-241377 filed on Dec. 25, 2018 including the specification, drawings and abstract is incorporated herein by reference in its entirety.

BACKGROUND

1. Technical Field

The disclosure relates to a vehicular charging control system using a solar panel and mounted in a vehicle.

2. Description of Related Art

Japanese Unexamined Patent Application Publication No. 2017-123765 (JP 2017-123765 A) discloses a vehicular solar power generation system in which electric power generated by a solar panel is supplied to a high-voltage battery for driving a motor and to a low-voltage battery for operating in-vehicle devices such as auxiliary machines.

SUMMARY

A vehicular charging control system may be configured such that a high-voltage battery for driving a motor is charged with electric power generated by a solar panel in order to utilize the electric power generated by the solar panel. With this configuration, the total electric power, which is the sum of electric power generated by the solar panel and regenerative electric power generated through regeneration by an actuator, is supplied to the high-voltage battery while a vehicle is traveling. This raises the possibility that the total electric power supplied to the high-voltage battery will exceed its charging capacity, resulting in overcharging of the high-voltage battery.

The disclosure provides a vehicular charging control system configured to prevent a high-voltage battery from being overcharged, while giving a higher priority to collection (effective utilization) of electric power generated through regeneration.

An aspect of the disclosure relates to a vehicular charging control system using a solar panel. The vehicular charging control system includes: a first battery; a calculation unit configured to calculate a chargeable electric power amount that is an amount of electric power with which the first battery is able to be charged until a state of charge of the first battery reaches a predetermined value; a determination unit configured to determine whether electric power is being generated through regeneration; and a control unit configured to control charging of the first battery with electric power generated by the solar panel. The control unit is configured to allow the first battery to be charged with the electric power generated by the solar panel in an amount up to an upper limit that is set to the chargeable electric power amount, when the determination unit determines that electric power is not being generated through regeneration. The control unit is configured to allow the first battery to be charged with the electric power generated by the solar panel in an amount up to an upper limit that is set to an electric power amount obtained by subtracting an amount of electric power generated through regeneration from the chargeable electric power amount, when the determination unit determines that electric power is being generated through regeneration.

With the vehicular charging control system according to the aspect of the disclosure, it is possible to prevent a high-voltage battery from being overcharged, while giving a higher priority to collection (effective utilization) of electric power generated through regeneration.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

In a vehicular charging control system using a solar panel according to the disclosure, when a high-voltage battery is charged with electric power generated by the solar panel in a state where the vehicle is able to travel, the high-voltage battery is allowed to be charged with the electric power generated by the solar panel up to an upper limit that is set to an amount of electric power with which the high-voltage battery can be charged (hereinafter, referred to as "chargeable electric power amount") when regenerative electric power is not being generated, and the high-voltage battery is allowed to be charged with the electric power generated by the solar panel up to an upper limit that is set to an electric power amount obtained by subtracting an amount of regenerative electric power from the chargeable electric power amount when regenerative electric power is being generated. With this control, it is possible to prevent the high-voltage battery from being overcharged, while giving a higher priority to collection (effective utilization) of regenerative electric power.

Embodiment

Configuration

Figure 1:
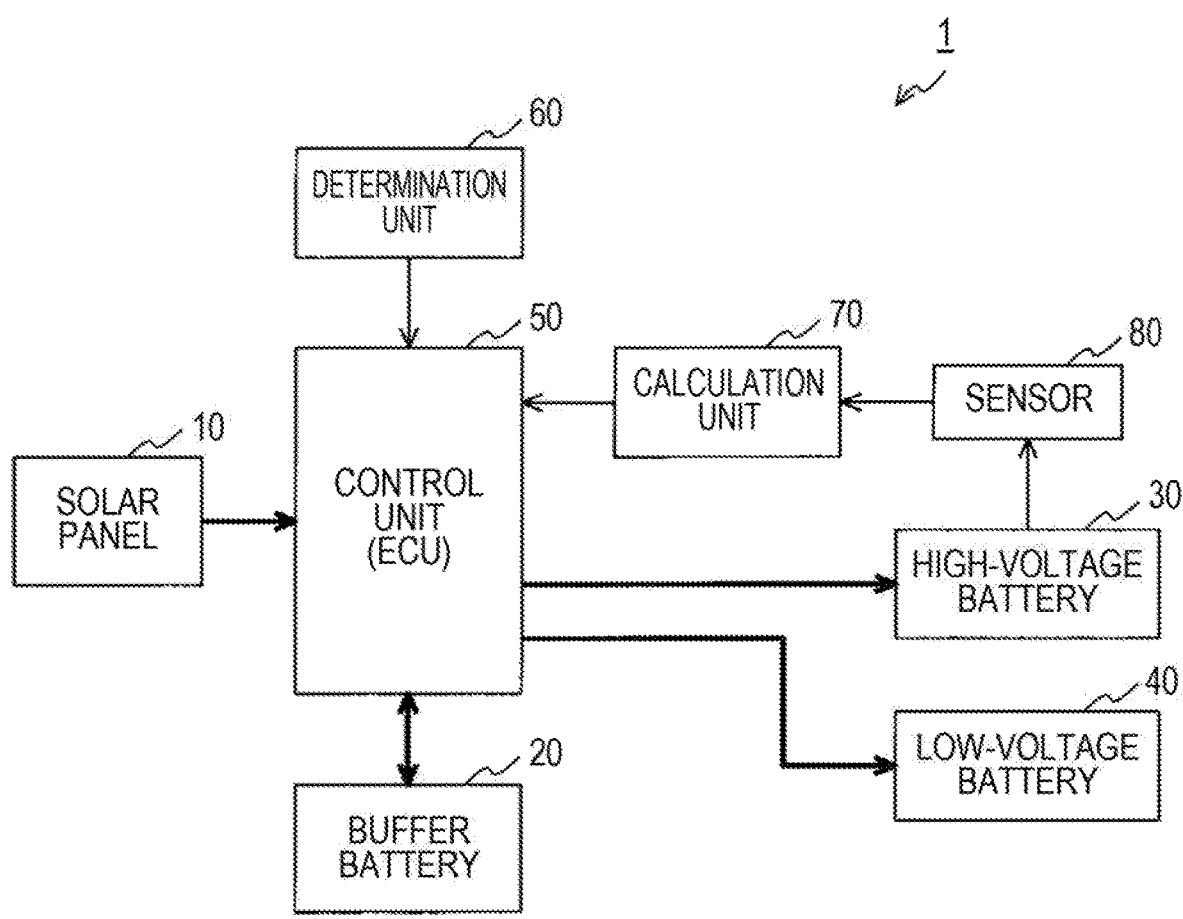
FIG. 1 is a block diagram illustrating an example of the configuration of a vehicular charging control system according to an embodiment of the disclosure.

FIG. 1 is a block diagram illustrating an example of the configuration of a vehicular charging control system 1 (hereinafter, referred simply to as "charging control system 1") according to an embodiment of the disclosure. The charging control system 1 illustrated in FIG. 1 includes a solar panel 10, a buffer battery 20, a high-voltage battery 30, a low-voltage battery 40, a control unit 50, a determination unit 60, a calculation unit 70, and a sensor 80. In FIG. 1, wide lines indicate paths through which electric power is supplied to the batteries, and narrow lines indicate paths through which control signals, measurement signals, and so forth are transmitted.

The charging control system 1 may be applied, for example, to a hybrid vehicle including a motor for traveling and an internal combustion engine, such as an engine, or to an electric vehicle.

The solar panel 10 is a solar cell module that is an assembly of solar cells configured to convert the energy of solar light into electric power. The electric power generated by the solar panel 10 is output to the control unit 50. The solar panel 10 may be installed, for example, on a roof of a vehicle.

The buffer battery 20 is a battery that temporarily stores electric power. The buffer battery 20 is a secondary battery (i.e., a rechargeable and dischargeable electrical battery), such as a lithium battery or a nickel-hydride battery. The buffer battery 20 is connected to the control unit 50 such that the buffer battery 20 can be charged with electric power generated by the solar panel 10 and the buffer battery 20 can discharge electric power that has been stored therein to the high-voltage battery 30 and the low-voltage battery 40.

The high-voltage battery 30 is a battery that supplies high-voltage electric power to, for example, a motor for traveling (not illustrated), which is a drive power source of the vehicle. The high-voltage battery 30 is a secondary battery (i.e., a rechargeable and dischargeable electrical battery), such as a lithium battery or a nickel-hydride battery. The high-voltage battery 30 is connected to the control unit 50 such that the high-voltage battery 30 can be charged with electric power generated by the solar panel 10 and electric power supplied from the buffer battery 20.

The low-voltage battery 40 is a battery that supplies electric power with a voltage lower than that of the high-voltage battery 30 to in-vehicle devices, such as a windshield wiper (not illustrated) and a headlight (not illustrated) that are mounted in the vehicle. The low-voltage battery 40 is a secondary battery (i.e., a rechargeable and dischargeable electrical battery), such as a lead storage battery. The low-voltage battery 40 can supply electric power to the control unit 50 and the sensor 80. The low-voltage battery 40 is connected to the control unit 50 such that the low-voltage battery 40 can be charged with electric power generated by the solar panel 10.

The determination unit 60 is configured to determine whether electric power is being generated through regeneration by an actuator, such as a power steering system or a brake mounted in the vehicle. The determination unit 60 can determine whether electric power is being generated through generation, based on the information acquired from a predetermined sensor (not illustrated) mounted in the vehicle.

The sensor 80 is configured to detect a state of the high-voltage battery 30. The sensor 80 includes, for example, a temperature sensor that detects a temperature of the high-voltage battery 30 and a voltage sensor that detects a voltage of the high-voltage battery 30. The detected state of the high-voltage battery 30 is transmitted to the calculation unit 70.

The calculation unit 70 acquires the state of the high-voltage battery 30 from the sensor 80, and then calculates an amount of electric power with which the high-voltage battery 30 can be charged until the state of charge (SOC) of the high-voltage battery 30 reaches a predetermined value from the acquired state of the high-voltage battery 30 (hereinafter, referred to as "chargeable electric power amount"). The predetermined value may be set, for example, based on an upper limit at and below which the high-voltage battery 30 is not overcharged.

The control unit 50 is an electronic control unit (ECU) connected to the solar panel 10, the buffer battery 20, the high-voltage battery 30, and the low-voltage battery 40, and configured to control charging of the batteries with the electric power generated by the solar panel 10. The control unit 50 has a power conversion function, so that the control unit 50 can convert (step up or step down) the voltage of the electric power generated by the solar panel 10 to a predetermined voltage and then cause the buffer battery 20 to store the electric power with the predetermined voltage or output the electric power with the predetermined voltage to the high-voltage battery 30 and/or the low-voltage battery 40. The control unit 50 can convert (step up or step down) the voltage of the electric power supplied from the buffer battery 20 into a predetermined voltage and then output the electric power with the predetermined voltage to the high-voltage battery 30 and/or the low-voltage battery 40.

The control unit 50 monitors a power generation state of the solar panel 10, and controls charging of the batteries with the electric power generated by the solar panel 10, based on electric power generated by the solar panel 10, a vehicle state that can be determined based on the information from a predetermined sensor (not illustrated) mounted in the vehicle, and an amount of electric power that is consumed by the in-vehicle devices connected to the low-voltage battery 40. This charging control will be described below in detail.

Charging Control

Figure 2:
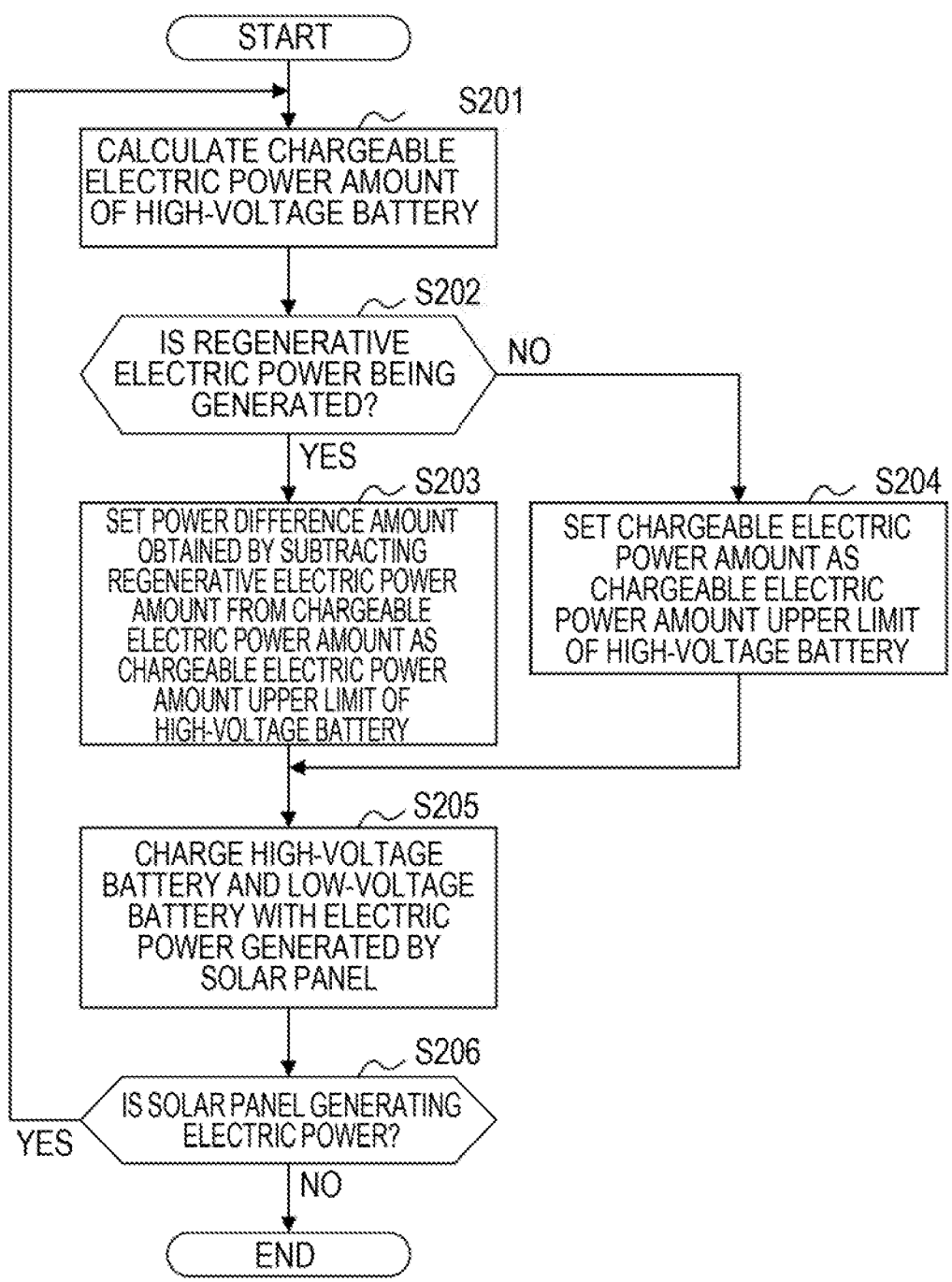
FIG. 2 is a flowchart illustrating a processing routine of charging control A executed by the vehicular charging control system.
Figure 3:
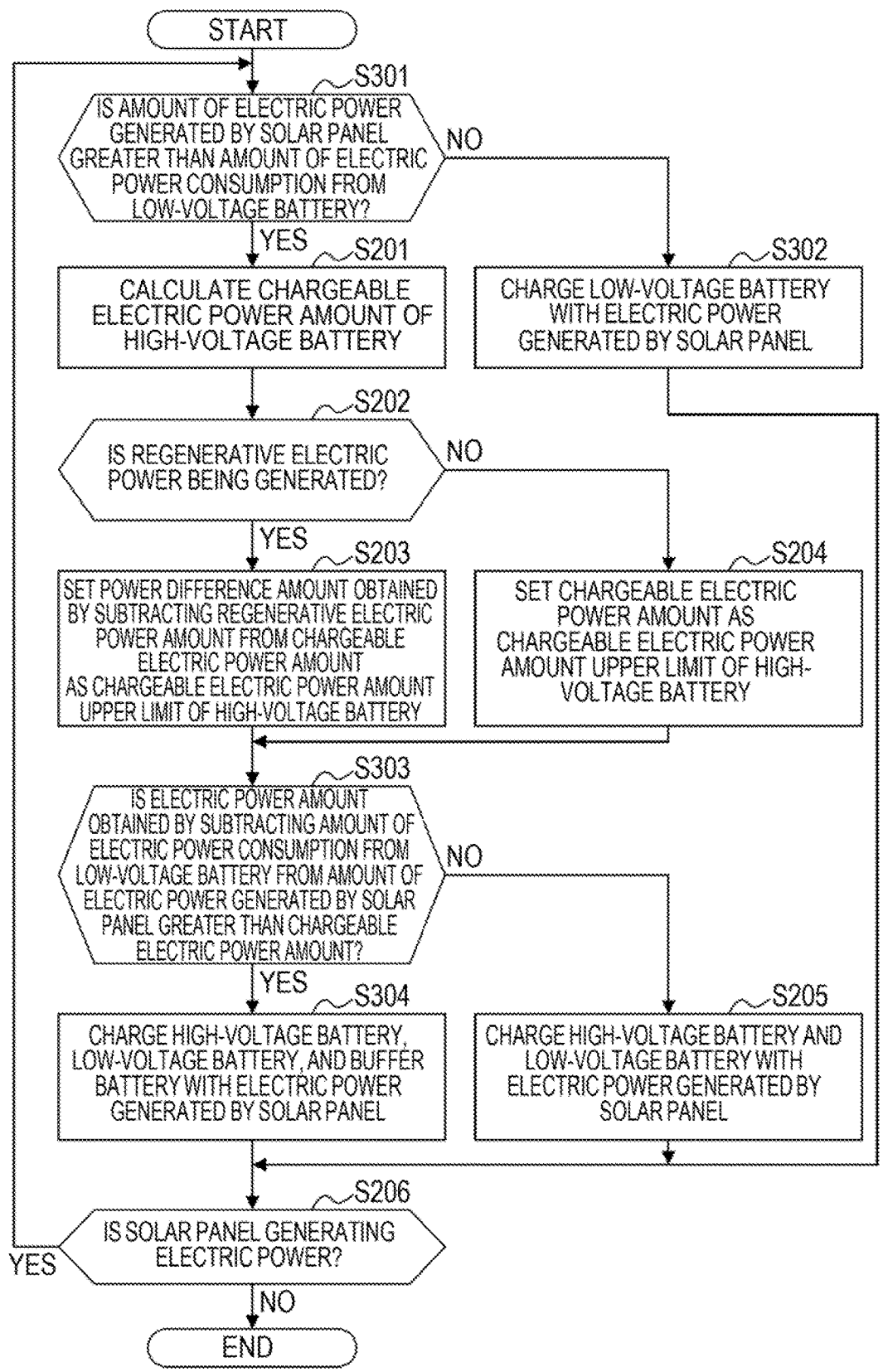
FIG. 3 is a flowchart illustrating a processing routine of charging control B executed by the vehicular charging control system.

The charging control executed by the vehicular charging control system 1 according to the embodiment of the disclosure will be described below referring further to FIG. 2 and FIG. 3. FIG. 2 is a flowchart illustrating a processing routine of charging control (charging control A) executed by the charging control system 1. FIG. 3 is a flowchart illustrating a processing routine of charging control (charging control B) executed by the charging control system 1.

(1) Charging Control A

Charging control A illustrated in FIG. 2 is started when the solar panel 10 generates electric power in a state where the vehicle is able to travel (READY-ON).

In Step S201, the calculation unit 70 calculates a chargeable electric power amount that is an amount of electric power with which the high-voltage battery 30 can be charged (hereinafter, referred to as "chargeable electric power amount of the high-voltage battery 30"). The chargeable electric power amount may be calculated based on the capacity of the high-voltage battery 30, the current state of charge (SOC) of the high-voltage battery 30, the upper limit of the SOC of the high-voltage battery 30, the voltage of the high-voltage battery 30, the temperature of the high-voltage battery 30, and so forth. For example, an amount of electric power that is required to increase the SOC of the high-voltage battery 30 from the current SOC to the upper limit is calculated as the chargeable electric power amount of the high-voltage battery 30. After the chargeable electric power amount of the high-voltage battery 30 is calculated, the processing routine proceeds to Step S202.

In Step S202, the determination unit 60 determines whether electric power is being generated through regeneration by a brake or a power steering system. Whether electric power is being generated through regeneration can be determined, for example, based on a change in the electric current or voltage in a predetermined power supply line. When the determination unit 60 determines that electric power is being generated through regeneration (YES in S202), the processing routine proceeds to Step S203. On the other hand, when the determination unit 60 determines that electric power is not being generated through regeneration (NO in S202), the processing routine proceeds to Step S204.

In Step S203, the control unit 50 calculates a power difference amount by subtracting a regenerative electric power amount (regenerative energy), which is an amount of electric power acquired through regeneration, from the chargeable electric power amount of the high-voltage battery 30. Then, the control unit 50 sets the calculated power difference amount as a chargeable electric power amount upper limit that is an upper limit up to which the high-voltage battery 30 can be charged with the electric power generated by the solar panel 10 (hereinafter, referred to as "chargeable electric power amount upper limit of the high-voltage battery 30" where appropriate). For example, when the chargeable electric power amount is A (Wh) and the regenerative electric power amount is B (Wh), the high-voltage battery 30 can be charged with the electric power generated by the solar panel 10, in an amount corresponding to the power difference amount (A−B) (Wh). After the chargeable electric power amount upper limit is set, the processing routine proceeds to Step S205.

In Step S204, the control unit 50 sets the chargeable electric power amount of the high-voltage battery 30 as the chargeable electric power amount upper limit up to which the high-voltage battery 30 can be charged with the electric power generated by the solar panel 10. For example, when the chargeable electric power amount is A (Wh), the electric power in the amount A (Wh) can be entirely covered by the electric power generated by the solar panel 10. After the chargeable electric power amount upper limit is set, the processing routine proceeds to Step S205.

In Step S205, the control unit 50 charges the high-voltage battery 30 and the low-voltage battery 40 with the electric power generated by the solar panel 10 based on the chargeable electric power amount upper limit. In this charging, the batteries to be charged with electric power may be prioritized. After charging is performed, the processing routine proceeds to Step S206.

In Step S206, the control unit 50 determines whether the solar panel 10 is generating electric power. When the control unit 50 determines that the solar panel 10 is generating electric power (YES in S206), the processing routine proceeds to Step S201. On the other hand, when the control unit 50 determines that the solar panel 10 is not generating electric power (NO in S206), the processing routine ends.

(2) Charging Control B

Charging control B illustrated in FIG. 3 includes processes of Steps S301 to S304, in addition to the processes of charging control A illustrated in FIG. 2. The processes of Steps S301 to S304, which are added to charging control A, will be described below.

Charging control B illustrated in FIG. 3 is started when the solar panel 10 generates electric power in a state where the vehicle is able to travel (READY-ON).

In Step S301, the control unit 50 determines whether an amount of electric power generated by the solar panel 10 is greater than an amount of electric power that is consumed by the in-vehicle devices connected to the low-voltage battery 40. The amount of electric power that is consumed by the in-vehicle devices connected to the low-voltage battery 40 may be calculated in each case based on the voltage and electric current of the low-voltage battery 40 or may be set in advance to a fixed value. When the control unit 50 determines that the amount of electric power generated by the solar panel 10 is greater than the amount of electric power that is consumed by the in-vehicle devices (YES in S301), the processing routine proceeds to Step S201. In other cases (NO in S301), the processing routine proceeds to Step S302.

In Step S302, the control unit 50 charges the low-voltage battery 40 with the electric power generated by the solar panel 10. After charging is performed, the processing routine proceeds to Step S206.

After the chargeable electric power amount upper limit of the high-voltage battery 30 is set in Step S203 or Step S204, the control unit 50 determines in step S303 whether an electric power amount obtained by subtracting the amount of electric power that is consumed by the in-vehicle devices from the amount of electric power obtained through power generation by the solar panel 10 is greater than the chargeable electric power amount of the high-voltage battery 30. The amount of electric power obtained through power generation by the solar panel 10 may be an electric power amount obtained by totaling the electric power obtained in a predetermined period or may be an electric power amount calculated based on the electric power obtained per unit time (e.g., per second). The amount of electric power that is consumed by the in-vehicle devices may be an electric power amount obtained by totaling the electric power consumed in the predetermined period or may be an electric power amount calculated based on the electric power consumed per unit time (e.g., per second). The predetermined period may be set to any given period depending on the performance required for the charging control. When the control unit 50 determines that the electric power amount obtained by subtracting the amount of electric power that is consumed by the in-vehicle devices from the amount of electric power obtained through power generation by the solar panel 10 is greater than the chargeable electric power amount (YES in S303), the processing routine proceeds to Step S304. In other cases (NO in S303), the processing routine proceeds to Step S205.

In Step S304, the control unit 50 charges the high-voltage battery 30, the low-voltage battery 40, and the buffer battery 20 with the electric power generated by the solar panel 10 based on the chargeable electric power amount upper limit of the high-voltage battery 30. In this charging, the batteries to be charged with the electric power may be prioritized. For example, the priority order may be the order of the low-voltage battery 40, the high-voltage battery 30, and the buffer battery 20. After charging is performed, the processing routine proceeds to Step S206.

Operations and Advantageous Effects

As described above, with the vehicular charging control system 1 according to the embodiment of the disclosure, when regenerative electric power is not being generated in the vehicle, the high-voltage battery 30 can be charged with electric power generated by the solar panel 10 up to the upper limit that is set to the chargeable electric power amount of the high-voltage battery 30. On the other hand, when regenerative electric power is being generated in the vehicle, the high-voltage battery 30 can be charged with the electric power generated by the solar panel 10 up to the upper limit that is set to the electric power amount obtained by subtracting the regenerative electric power amount from the chargeable electric power amount of the high-voltage battery 30.

With this control, a higher priority is given to utilization of the electric power generated through regeneration than to utilization of the electric power generated by the solar panel 10. By charging the battery with the regenerative electric power without any limitation, it is possible to reduce the possibility that a driver will feel that regenerative braking is less effective (the braking is not sufficiently applied). With this control, the amount of electric power used to charge the high-voltage battery 30 is limited to the chargeable electric power amount. Thus, it is possible to prevent the high-voltage battery 30 from being overcharged. By preventing the high-voltage battery 30 from being overcharged, it is possible to prevent execution of an operation that will affects the behavior of the vehicle. For example, it is possible to prevent the situation where the surplus electric power received by the high-voltage battery 30 is consumed by operating an engine starter (by causing the engine to race).

With the vehicular charging control system 1 according to the embodiment of the disclosure, when the amount of electric power generated by the solar panel 10 is equal to or less than the amount of electric power that is consumed by the in-vehicle devices connected to the low-voltage battery 40, the entirety of the electric power generated by the solar panel 10 is used to charge the low-voltage battery 40.

With this control, when the entirety of the electric power generated by the solar panel 10 can be consumed by the in-vehicle devices, the entirety of the electric power generated by the solar panel 10 is used to charge the low-voltage battery 40. Thus, it is possible to prevent the behavior of the vehicle from being affected by charging of the high-voltage battery 30 during traveling.

With the vehicular charging control system 1 according to the embodiment, when the electric power amount obtained by subtracting the amount of electric power that is consumed by in-vehicle devices connected to the low-voltage battery 40 from the amount of electric power acquired from the solar panel 10 is equal to or less than the chargeable electric power amount of the high-voltage battery 30, the electric power generated by the solar panel 10 is used to charge the high-voltage battery 30 and the low-voltage battery 40. On the other hand, when the electric power amount obtained by subtracting the amount of electric power that is consumed by the in-vehicle devices connected to the low-voltage battery 40 from the amount of electric power acquired from the solar panel 10 is greater than the chargeable electric power amount of the high-voltage battery 30, the electric power generated by the solar panel 10 is used to charge the buffer battery 20, in addition to the high-voltage battery 30 and the low-voltage battery 40.

With this control, the buffer battery 20 can be charged with a surplus amount of electric power that can be received by neither the high-voltage battery 30 nor the low-voltage battery 40. Therefore, it is possible to highly efficiently charge the batteries with the electric power acquired from the solar panel 10.

The disclosure is applicable to, for example, a charging control system for, for example, a vehicle in which electric power generated by a solar panel is used.

What is claimed is:
1. A vehicular charging control system using a solar panel, the vehicular charging control system comprising:
   a first battery;
   a second battery having a rated voltage that is lower than a rated voltage of the first battery, the second battery being able to be charged with the electric power generated by the solar panel;
   a third battery that is a battery for temporary charging;
   a calculation unit programmed to calculate a chargeable electric power amount that is an amount of electric power to charge the first battery until a state of charge of the first battery reaches a predetermined value;
   a determination unit programmed to determine whether electric power is being generated through regeneration; and
   a control unit programmed to:
      control charging of the first battery with electric power generated by the solar panel,
      allow the first battery to be charged with the electric power generated by the solar panel in an amount up to an upper limit that is set to the chargeable electric power amount, in response to the determination unit determining that electric power is not being generated through regeneration,
      allow the first battery to be charged with the electric power generated by the solar panel in an amount up to an upper limit that is set to an electric power amount obtained by subtracting an amount of electric power generated through regeneration from the chargeable electric power amount, in response to the determination unit determining that electric power is being generated through regeneration,
      charge the second battery with all of the electric power generated by the solar panel, in response to an amount of electric power generated by the solar panel being equal to or less than an amount of electric power that is consumed by an in-vehicle device connected to the second battery,
      allow the first battery and the second battery to be charged with the electric power generated by the solar panel, in response to an amount of electric power obtained by subtracting the amount of electric power that is consumed by the in-vehicle device connected to the second battery from the amount of electric power generated by the solar panel being equal to or less than the chargeable electric power amount, and
      allow the first battery, the second battery, and the third battery to be charged with the electric power generated by the solar panel, in response to the electric power amount obtained by subtracting the amount of electric power consumed by the in-vehicle device connected to the second battery from the amount of electric power generated by the solar panel being greater than the chargeable electric power amount.

* * * * *